(12) United States Patent
Deepak et al.

(10) Patent No.: US 7,403,961 B1
(45) Date of Patent: Jul. 22, 2008

(54) DANGLING REFERENCE DETECTION AND GARBAGE COLLECTION DURING HARDWARE SIMULATION

(75) Inventors: Kumar Deepak, San Jose, CA (US); Sushama Ghanekar, San Jose, CA (US); Sonal Santan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 435 days.

(21) Appl. No.: 10/388,935

(22) Filed: Mar. 14, 2003

(51) Int. Cl.
*G06F 12/00* (2006.01)
*G06F 17/30* (2006.01)
*G06F 17/50* (2006.01)
*G06F 11/00* (2006.01)

(52) U.S. Cl. .................. 707/206; 707/200; 703/13
(58) Field of Classification Search ......... 707/200–206; 703/13–14
See application file for complete search history.

(56) References Cited

U.S. PATENT DOCUMENTS

| | | | | |
|---|---|---|---|---|
| 4,775,932 A * | 10/1988 | Oxley et al. | .................. | 707/206 |
| 5,628,016 A * | 5/1997 | Kukol | .................. | 717/140 |
| 5,911,144 A * | 6/1999 | Schwartz et al. | ............ | 707/206 |
| 6,453,430 B1 * | 9/2002 | Singh et al. | .................. | 714/47 |
| 6,473,773 B1 * | 10/2002 | Cheng et al. | ................ | 707/200 |
| 6,718,485 B1 * | 4/2004 | Reiser | .......................... | 714/38 |
| 6,993,770 B1 * | 1/2006 | Detlefs et al. | ................ | 719/315 |

* cited by examiner

*Primary Examiner*—Hung T Vy
(74) *Attorney, Agent, or Firm*—Robert Brush; Michael R. Hardaway (57) ABSTRACT

A method of dangling reference detection and garbage collection of VHDL objects within a program includes the steps of providing an Access Value having an Object Reference pointing to an Allocated Object and having and an Access Count pointer pointing to an integer object named Access Count which models a shared access count for the access values. The method sets the Object Reference and the Access Count pointer to null when constructing a new access value and enables an assignment of a negative Access Count to the shared access count when de-allocating a pointer to the Allocated Object. The method also maintains an exact count of a number of pointers pointing to the Allocated Object.

20 Claims, 7 Drawing Sheets

FIG. 10
100

DANGLING REFERENCE DETECTION AND GARBAGE COLLECTION DURING HARDWARE SIMULATION

BACKGROUND OF THE INVENTION

1. Technical Field

The present invention relates to the field of dangling reference detection and garbage collection, more particularly, to dangling access values and garbage collection of objects in a simulation environment.

2. Description of the Related Art

A logic simulator is a software tool, which is capable of performing functional and timing simulations for digital electronic designs which are written in a hardware description language such as Very High Speed Integrated Circuit Hardware Description Language (VHDL) or Verilog. VHDL, for example, permits hardware designers to define signals at a very high level of abstraction. The abstracted signal representations can be translated to actual pins on a microchip using any of a variety of commercial electronic design automation (EDA) software tools.

VHDL provides a measure of flexibility by allowing hardware designers to declare signals of various user-defined types. A user-defined type can either be a scalar or a composite type. Scalars further can be subdivided into four different types, namely enumeration, integer, floating point, and physical. Composites, however, can be subdivided into two types: arrays and records. Still, other defined types include access types and file types.

Scalar and composite types are generally used to represent either single data items or regular collections of data. In some applications such as simulation programs, collections of data of unknown size might need to be stored. Scalar and composite types are insufficient when data objects need to be created as required during a simulation and where links between the data objects need to be represented. In VHDL, access types are primarily used for this function.

In VHDL, access types are used mainly in high-level behavioral models. Access types support dynamic allocation of objects, which is very useful for writing testbenches. An access type in VHDL is like a pointer type found in many programming languages. An access value is like a pointer in VHDL, which points to a dynamically allocated object in VHDL. In VHDL, unlike high level programming languages like C++, an access value can only point to a dynamically allocated object. In particular it can not point to an object created by an object declaration such as a variable declaration.

Although several garbage collecting techniques are known and used by high level programming languages such as JAVA and C++ or in operating systems, such existing techniques will be either inefficient or would render many runtime applications useless in practical terms when used in an HDL Simulation environment. For example, the existing techniques for garbage collecting would utilize excessive amounts of CPU resources to allow a simulation program to operate effectively.

Thus, a technique and system is needed in simulation programs and other programs that efficiently detects dangling references as well as memory leaks and efficiently performs garbage collection of objects.

SUMMARY OF THE INVENTION

Embodiments in accordance with the present invention provide a method, system, and apparatus for performing dangling reference detection of access values and garbage collection of objects efficiently. More particularly, exemplary embodiments in accordance with the present invention realize significant performance benefits in the context of logic simulation by utilizing a shared access count for the access values and maintaining an exact count of a number of pointers pointing to an object in the process of detecting dangling references and garbage collecting of objects such as VHDL objects. The ability to assign a negative access count to the shared access count when de-allocating a pointer to an object aides in the efficient method. Note, garbage collection can and typically includes the function of memory leak detection.

One aspect of the present invention can include a method of garbage collecting access values within a program comprising the steps of modeling a shared access count for the access values, enabling an assignment of a negative access count to the shared access count when de-allocating a pointer to an object, and maintaining an exact count of a number of pointers pointing to the object.

In a second aspect of the invention, a method of detecting dangling references and garbage collecting objects within a program can comprise the steps of providing at least one access value each having an object reference pointing to an allocated object and having and at least one access count pointer pointing to an integer object modeling a shared access count for the access values, setting the object reference and the access count pointer to null when constructing a new access value, enabling an assignment of a negative access count to the shared access count when de-allocating a pointer to the allocated object, and maintaining an exact count of a number of pointers pointing to the allocated object.

In a third aspect of the present invention, a machine readable storage has a computer program having a plurality of code sections executable by a machine for causing the machine to perform the steps described in either the first aspect or the second aspect of the present invention.

In a fourth aspect of the present invention, a system for performing detection of dangling references of access values and garbage collection of objects comprises means for modeling a shared access count for the access values, means for enabling an assignment of a negative access count to the shared access count when de-allocating a pointer to an object, and means for maintaining an exact count of a number of pointers pointing to the object.

BRIEF DESCRIPTION OF THE DRAWINGS

There are shown in the drawings embodiments which are presently preferred, it being understood, however, that the invention is not so limited to the precise arrangements and instrumentalities shown.

DETAILED DESCRIPTION OF THE INVENTION

Exemplary embodiments in accordance with the present invention provide a method, system, and apparatus for performing a dangling reference detection of access values as well as garbage collection of objects such as VHDL objects. In VHDL, an access value is like a pointer pointing to VHDL objects which if not freed up explicitly by a user could then result in memory leak and hence into "garbage." Although the description and examples discussed herein are in the context of a VHDL simulation program, it should be understood that the present invention is not limited thereto and can be applicable to other hardware languages that support pointers and dynamic allocations as well. The concepts of the present invention in a broader sense are also applicable to any hardware or software programming language supporting pointers. The claims are also intended to cover high level software programming languages that support pointers and dynamic allocations. For example, embodiments in accordance with the present invention can be used for modeling a pointer object in high level languages such as C++. A JAVA runtime environment could also utilize the techniques disclosed and claimed herein as well.

As discussed above, an access value is constructed as an object having two components in it. The first component is called Object Reference and it is a pointer pointing to the allocated VHDL object (termed as Referenced VHDL Object). When an Object Reference is set to null, the access value is not pointing to any VHDL object. The second component of the access value is called Access Count Pointer and it can be a null pointer or can point to an integer object called Access Count. The Access Count object is dynamically allocated and more than one access value can point to it as will become apparent in the examples below. When a new access value is constructed, the Object Reference and the Access Count Pointer both are set to null. An exemplary algorithm for keeping count of access value references to a dynamically allocated VHDL object and detection of memory leak is found below. Note, that the algorithm can keep count for multiple access values referencing multiple dynamically allocated objects.

Construction of an Access Value
   Set Access Count pointer to null.
   If initialized with another access value, treat the initialization as an assignment statement and execute the steps describing the assignment of an Access Value when the Access Value is on the right hand side. Otherwise (else), if the Access Count pointer is initialized with a newly allocated VHDL object then, make the Object Reference point to the allocated VHDL object. Else (i.e. if not initialized), set the Object Reference to null.

Figure 10:
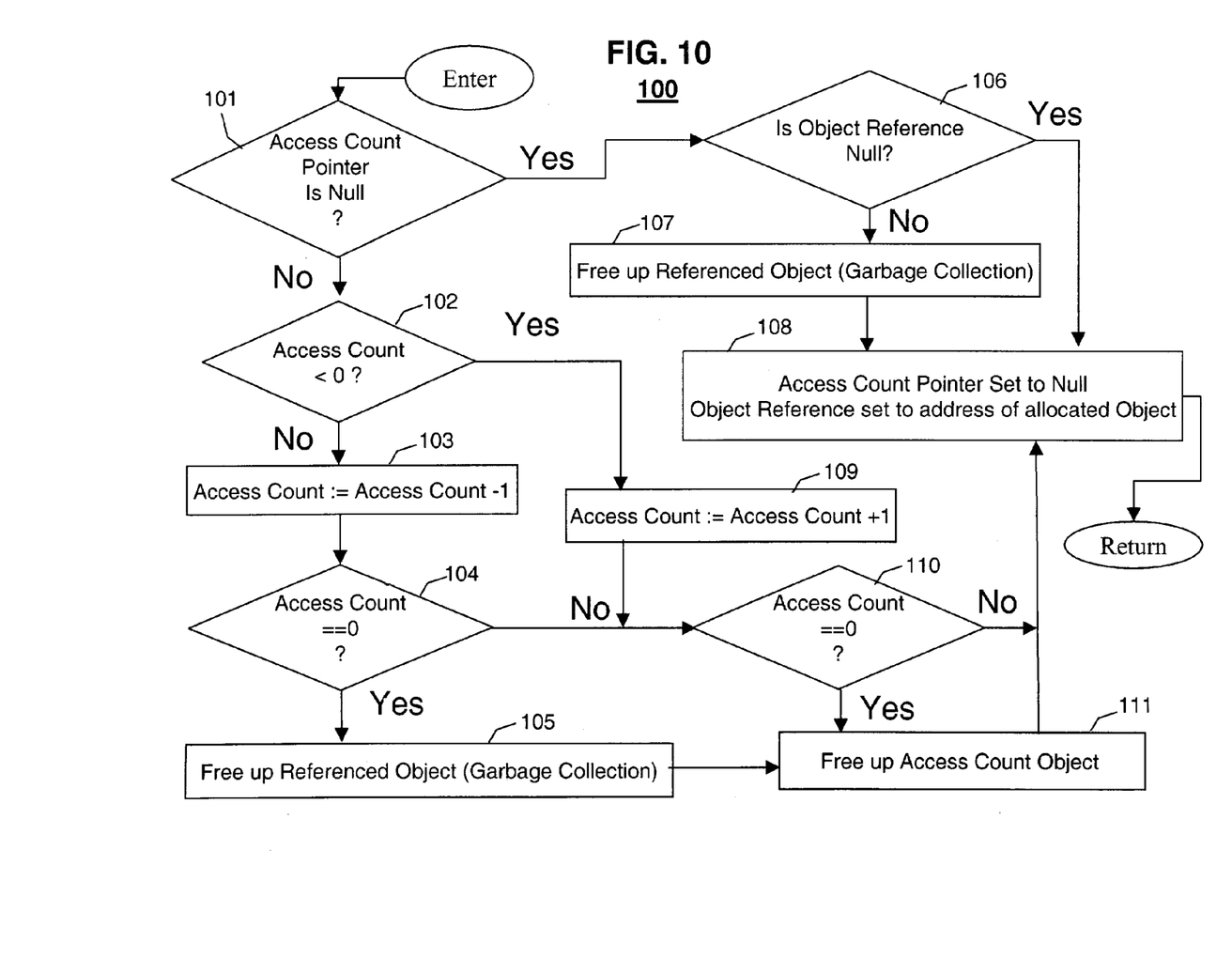
FIG. 10 is a flow chart illustrating the assignment of access values in accordance to the present invention.

Assignment to an Access Value
   If the right hand side of the assignment has a VHDL object allocation, then execute steps in describing the VHDL object allocation on the right hand side. Else (i.e. if the Access Value is being assigned with another access value) execute the steps in the section describing the assignment of Access Value on the Right Hand Side.
   Symbols used in the algorithm have the following meanings:
   < means less than
   > means grater than
   == means equal to
   := means assign to
   + and − are arithmetic plus and minus operators Assignment to an Access Value: VHDL Object Allocation on the Right Hand Side
   If the right hand side of an assignment has an implicit access value being created by a VHDL allocator "new", then use the following algorithm:
   If (Access Count Pointer is null {
   If(Object Reference is non-null) {
      Free up Referenced VHDL Object (Garbage Collection);
   }
   } else {
   if(Access Count < 0) {
      Access Count Access Count +1;
   } else {
      Access Count := Access Count −1;
      If (Access Count == 0)
         Free up Referenced VHDL Object (Garbage Collection);
   {
   if(Access Count == 0) {
      Free up Access Count Object pointed to by Access Count Pointer;
   }
   }
   Access Count Pointer := null;
   Object Reference := address of allocated VHDL object;
   The algorithm above is also illustrated in FIG. 10 as method 100. Specifically, if the Access Count Pointer is Null in decision block 101, then a determination is made in decision block 106 whether an Object Reference is null. If the Object Reference is non-null at decision block 106, then the Referenced Object is freed up at block 107 and thus memory being leaked is garbage collected. Subsequently, the Access Count pointer is set to null and the Object Reference is assigned the address of the allocated object at block 108 before returning. If the Object reference is null at decision block 106, then the method proceeds to block 108 before returning. If the answer at decision block 101 is no, then it is determined if the Access Count is less than zero (0) at decision block 102. If the answer at decision block 102 is no (i.e., Access Count is greater than 0), then the Access Count is assigned to Access Count −1 at block 103. Subsequently, if the Access Count has become zero at decision block 104, then memory is about to leak so, the about to leak object is garbage collected in block 105. Then, the Access Count Object is freed up at block 111, the Access Count pointer set to null and the Object Reference assigned the address of the allocated object at block 108 before returning. However, if the answer at decision block 102 is yes, then the Access Count is assigned to Access Count +1 at block 109. Next, the method determines if the Access Count is 0 at decision block 110. If the Access Count does not equal 0 at decision block 110, then the Access Count pointer is set to null and the Object Reference is assigned the address of the allocated object at block 108. If the Access Count does equal 0 at decision block 110, then the Access Count Object is freed up at block 111 before having the Access Count pointer set to null and the Object Reference assigned the address of the allocated object at block 108.

Assignment to an Access Value: Access Value on the Right Hand Side

Note: Left hand side (LHS) is prefixed to all components meant for an access value on the left-hand side of the assignment. Right hand side (RHS) is prefixed to all components meant for an access value on the right-hand side of the assignment.

```
if (LHS access value==RHS access value ) {
Do nothing, just return as it is a case of self-assignment;
}
if (LHS Access Count Pointer is null) {
if(Object reference is non null)
Free up Referenced VHDL Object(Garbage Collection)
}
if (LHS Access Count Pointer is non null) {
if(LHS Access Count <0) {
LHS Access Count := LHS Access Count +1;
} else {
LHS Access Count := LHS Access Count −1;
if(LHS Access Count == 0) {
    Free up the Referenced Object(Garbage Collection);
}
}
if(LHS Access Count == 0) {
Free up the Access Count Object pointed to by LHS Access
   Count Pointer;
}
}
LHS Access Count Pointer := null;
LHS Object Reference := null;
if(RHS Access Count Pointer is non-null ) {
if(RHS Access Count <0) {
RHS Access Count := RHS Access Count −1;
} else {
LHS Access Count Pointer := RHS Access Count Pointer;
RHS Access Count := RHS Access Count +1;
LHS Object Reference := RHS Object Reference;
}
} else {
if(RHS Object Reference is non-null) {
RHS Access Count Pointer :=Allocate a new Access Count
   Object;
RHS Access Count := 2 ;
LHS Access Count Pointer := RHS Access Count Pointer;
LHS Object Reference := RHS Object Reference;
}
}
```

De-Allocation of Referenced VHDL Object

Figure 11:
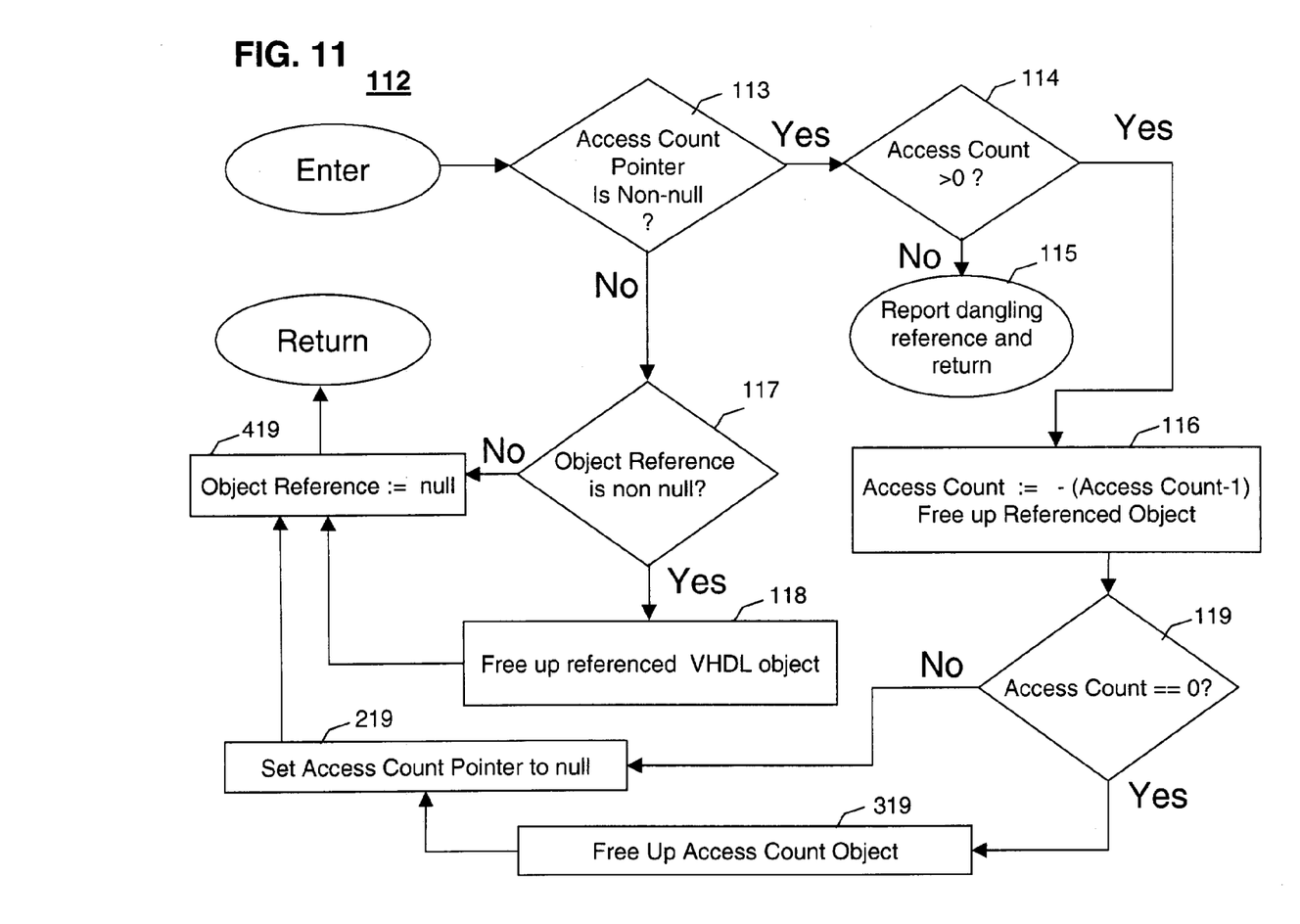
FIG. 11 is a flow chart illustrating the method of de-allocation in accordance to the present invention.

The algorithm for the de-allocation of a referenced VHDL object is illustrated in FIG. 11 as method 112. This aspect of the invention enables an assignment of a negative access count to a shared access count when de-allocating a pointer to an object. When a de-allocation of a referenced object is called, then a determination is made at decision block 113 whether the access count pointer is non-null. If the answer at decision block 113 is no, then it checks at block 117 if the Object Reference is non-null, and if so, the method frees up the referenced object (such as a VHDL object) at step 118 and assigns the object reference to null at step 419 before returning. If answer at 117 is no, then it simply sets the Object Reference to null at step 419 before returning. If the answer at the block 113 is yes, then at decision block 114, a determination is made whether the access count is greater than zero. If the access count is not greater than zero at decision block 114, then a dangling reference is detected and reported at step 115 before it returns back. If an access count is greater than zero at decision block 114, then the Access Count is assigned to the negative of Access Count −1 and the referenced Object is freed up at block 116. Then, at decision block 119, a determination is made whether the access count equals zero. If the access count is equal to zero at decision block 119, then the method frees up the access count object at step 319, sets the access count pointer to null at step 219 and sets the object reference to null at step 419. If the access count does not equal to zero at decision block 119 then it skips block 319 and directly goes to step 219. After setting the access count pointer to null at step 219, the method proceeds to step 419 before returning back. Such algorithm is illustrated below:

```
if (Access Count Pointer is non-null ) {
if(Access Count > 0) {
Access Count := −(Access Count −1) ;Free up Referenced
   VHDL Object;
} else {
Detect Dangling reference ;
Return;
}
{
if(Access Count ==0) {
Free up Access Count Object;
}
Set Access Count pointer to null;
} else {
if(Object Reference is non-null)
Free up Referenced VHDL Object;
}
Object Reference := null;
```

If an access value has a non-null Access Count Pointer and it's access count is less than 0, this is a case of dangling reference. While accessing a VHDL Object by means of an access value, a dangling reference check can be made, caught and reported. Such a check can help in providing meaningful debugging information to a user instead of letting a program fall into an undesired and hard to understand fatal exception.

Destruction of an Access Value

Figure 12:
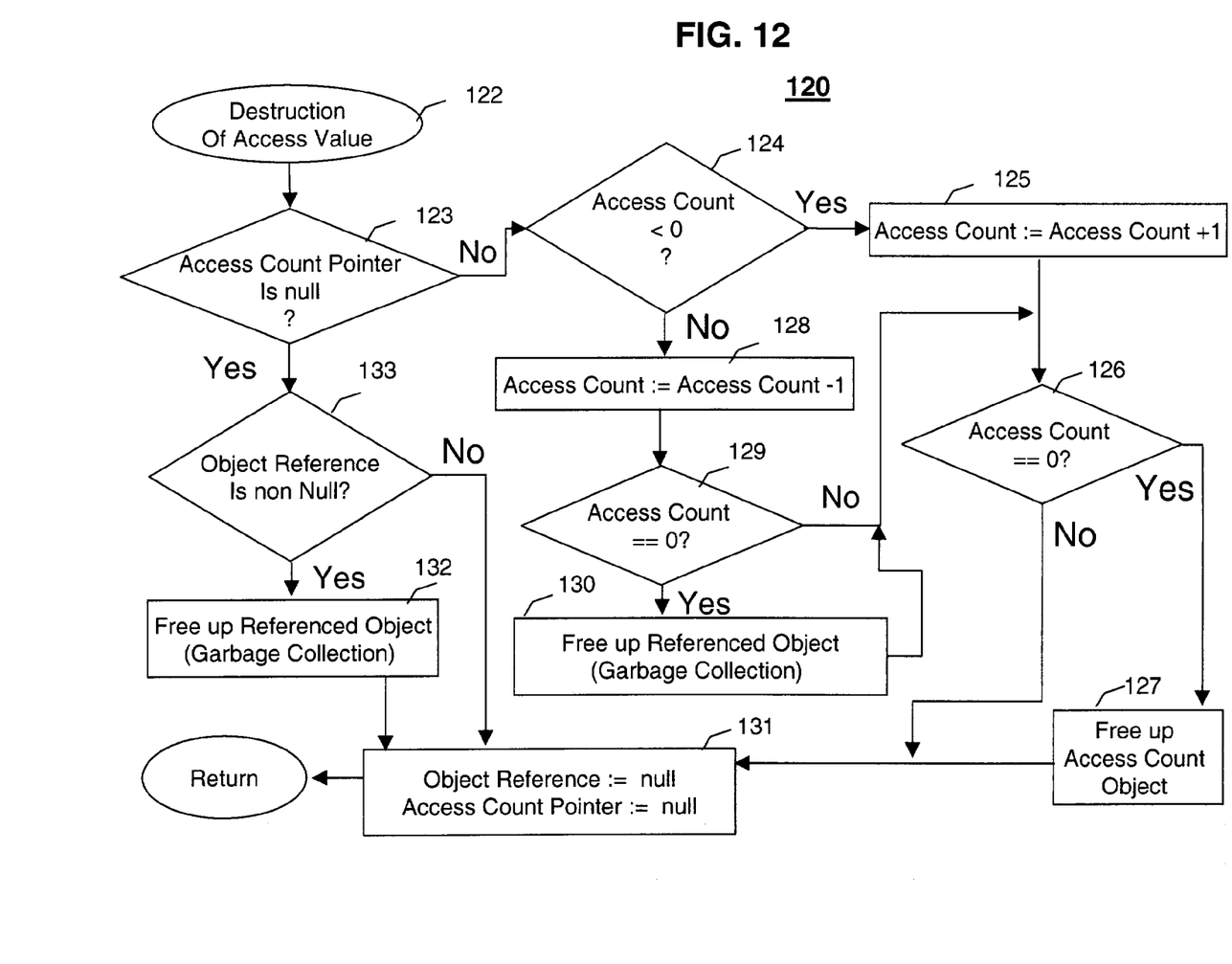
FIG. 12 is a flow chart illustrating the destruction of access values in accordance to the present invention.

The destruction of an Access Value algorithm as method 120 is illustrated in the flow chart of FIG. 12. If the destruction of an access value is called for at step 122 then it is determined at decision block 123 if the Access Count pointer is null. If the Access Count pointer is null at decision block 123, then a further check is made at decision block 133 if the Object reference is non-null. If the answer at block 133 is yes, then the referenced object (such as a VHDL object) is released or freed-up at block 132, the object reference is set to null and the Access Count pointer is set to null at block 131 before returning. If the answer at block 133 is no however, then it goes to block 131 directly and sets the Object Reference and the Access Count Pointer both to null before returning. At block 123, if the Access Count pointer is not null, then it is determined if the Access Count is less than 0 at decision block 124. If the answer at decision block 124 is yes, then the Access Count is set to Access Count +1 at block 125. Subsequently, a determination is made at decision block 126 whether the Access Count has turned to zero. If the answer is no, then it goes to block 131 and sets the Object Reference and the Access Count Pointer to null before returning. If the answer is yes at block 126, then it frees up the Access Count Object at block 127 and goes to block 131 where it sets the Access Count Pointer and the Object Reference to null before returning. If the answer at decision block 124 is no (i.e., the Access Count is greater than 0, and note that it can not be zero), then the Access Count is set to Access Count −1 at block 128. Next, it is determined if the Access Count is equal to zero at another decision block 129. If the Access Count is not equal to zero at decision block 129, then it goes to block 131 and sets the Object reference and the Access Pointer to null and returns. However, if the Access Count is zero at decision block 129 then memory is about to leak, hence the referenced object is garbage collected (and freed up) at block 130. Subsequently, the method proceeds to step 127 and frees up the Access Count object as well before proceeding to step 131 where it sets the Object Reference and the Access Count Pointer to null and returns.

The algorithm for the destruction of an Access Value is as follows:

If (Access Count Pointer is null {
If(Object Reference is non-null) {
Free up Referenced VHDL Object (Garbage Collection);
}
} else {
if(Access Count < 0)
Access Count Access Count +1;
Else {
Access Count := Access Count −1;
If(Access Count == 0)
   Free up Referenced VHDL Object (Garbage Collection);
}
if(Access Count == 0) {
Free up Access Count Object;
}
}
Object Reference := null;
Access Count Pointer:= null;

The following is an example of how the algorithms in accordance with the present invention would operate.

Let's assume there are four access values in a VHDL test bench and they are: a1, a2, a3, a4. Let's assume these access values are of an access type acc_t and acc_t is such that the access value of acc_t can point to a dynamically allocated object of a val_t kind where val_t is a VHDL type suitable for creating VHDL objects. So the access values a1, a2, a3, a4 are declared as:

variable a1: acc_t;
variable a2: acc_t;
variable a3: acc_t :=new val_t;
variable a4: acc_t;

a1, a2, and a4 get created with no Object Reference so they are null access values. a3 has an Object reference pointing to a new object of type val_t. The Access Count Pointer of all of these are null.

Figure 1:
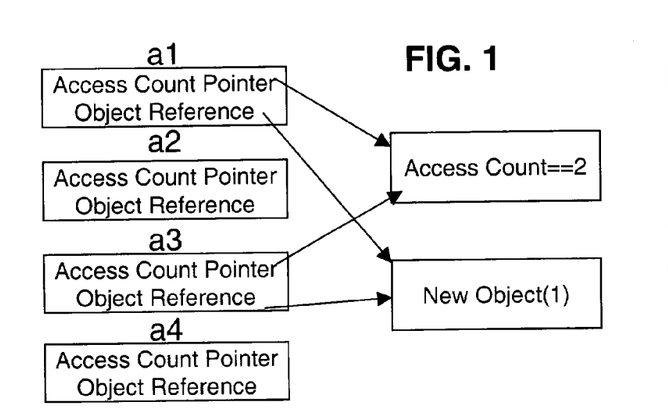
FIG. 1 is a schematic diagram illustrating access variables pointing to a common object and a shared access count object during a first stage in accordance to the present invention.

Now, let's assume a1 :=a3 is executed, i.e. make a1 point to the object pointed by a3. The following will happen:

Create an integer Access Count object (neither a1 nor a3 has any at this point)
Set the value of this Access Count Object to 2 as a1 and a3 are pointing to the same object.
Make a1's and a3's Access Count Pointer point to this common Access Count Object.
Make a1's Object Reference point to the object pointed to by the Object Reference of a3. FIG. 1 represents the status of the algorithm thus far.

Figure 2:
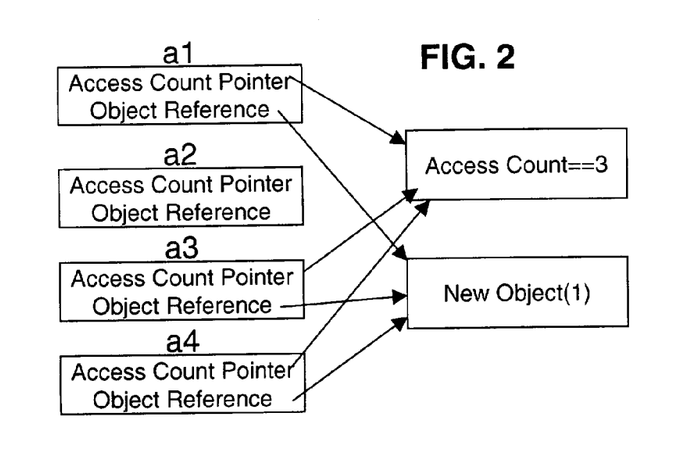
FIG. 2 is a schematic diagram illustrating access variables pointing to a common object and a shared access count object during a second stage in accordance to the present invention.

Next, let's assume a4:=a1 is executed. The following will happen:

Since a4 has an Access Count pointer of null, make it's Access Count Pointer point to the Access Count object pointed to by the Access Count pointer of a1.
Increment the value of the Access Count object shared by a1, a3 and a4 by 1 i.e. set it to 3 now. Now, there are three access values pointing to the same Referenced Object.
Make a4's Object Reference point to the object pointed to by the Object Reference of a3. FIG. 2 represents the status of the algorithm thus far.

Next, let's assume a2:=new val_t; is executed, then a2's Object Reference is set to point to the object created by new val_t object. The Access Count pointer remains null. Next, let's assume a1 :=a2 is executed, the following will happen:

a1's Object Reference was pointing to the object pointed to by a4 and a3. Now a1 should no longer be pointing to the object to which a4 and a3 point to. So decrement the content of the Access Count shared between a4 and a3 by 1 i.e. set it to 2.
Make a1's Object Reference point to the object pointed to by a2.
Now if a2 had an Access Count object to which it's Access Count Pointer were pointing to, then a1's Access Count pointer would have been made to point to a2's Access Count Object and the Access Count value would have been incremented by one. But, a2 has a null Access Count Pointer. So, allocate a new Access Count object, set it's value to 2 and make the Access Count Pointer of a1 and a2 both point to this new Access Count Object.

Figure 3:
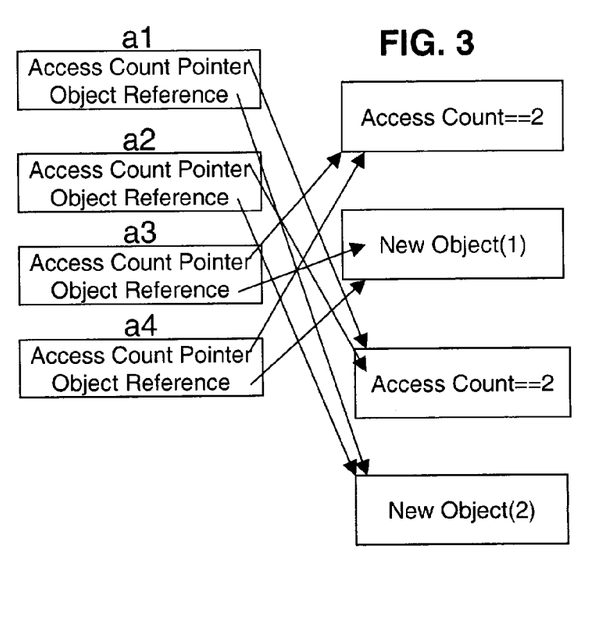
FIG. 3 is a schematic diagram illustrating access variables pointing to a common object and a shared access count object during a third stage in accordance to the present invention.

Now a1 and a2 point to a common Access Count Object and to a common Referenced VHDL object. On the other hand a3 and a4 point to a common Access Count Object and to a common Referenced VHDL object. FIG. 3 represents the status of the algorithm thus far.

Figure 4:
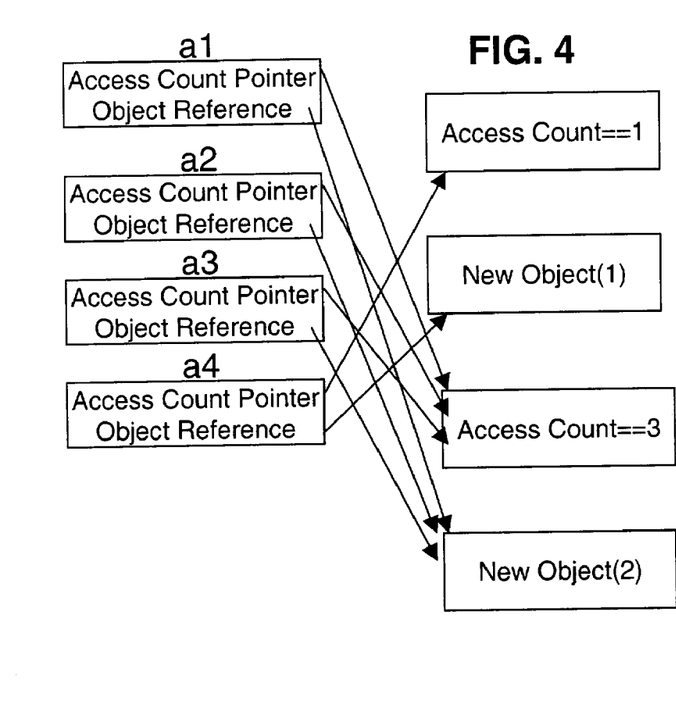
FIG. 4 is a schematic diagram illustrating access variables pointing to a common object and a shared access count object during a fourth stage in accordance to the present invention.

Next, let's assume, a3:=a1 is executed, the following should happen:

Decrement the Access Count object pointed to by a3, now it becomes 1 and only other remaining access value pointing to it is a4. And a4 also is the only access value pointing to the Referenced VHDL Object.
Increment the Access Count Object value pointed to by a1 by 1. So, now, it becomes 3. Make a3's Access Count Pointer point to the Access Count Object being pointed to by a1 (which has value 3 now). FIG. 4 represents the status of the algorithm thus far.

Now let's assume a4:=a3 is executed.

Figure 5:
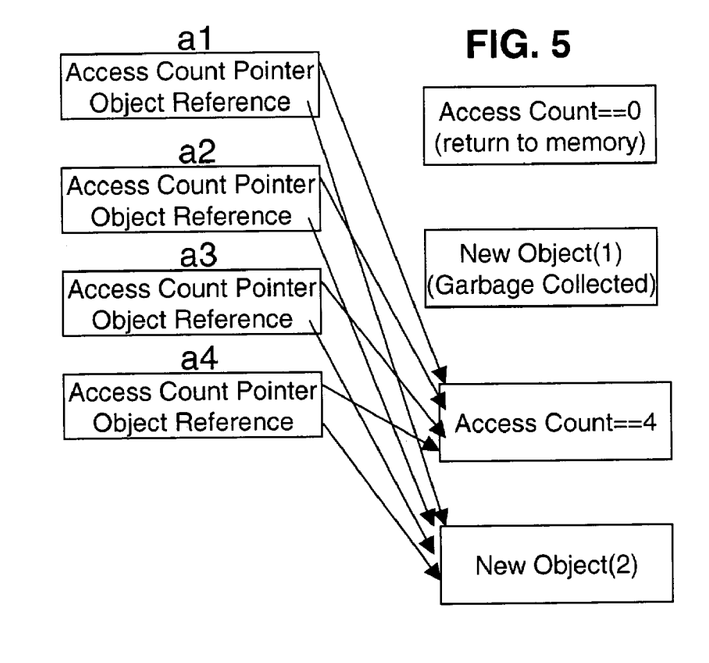
FIG. 5 is a schematic diagram illustrating access variables pointing to a common object and a shared access count object during a fifth stage in accordance to the present invention.

Decrement the Access Count Value pointed to by a4. It's value was 1, so after decrementing, it becomes 0. Since no one else is pointing to the val_t object being pointed to by a4, the memory used by the referenced object is going to leak. Garbage collect this memory and return it to the system. Also the Access Count object pointed to by a4 is no longer in use, so return the memory used by the Access Count object pointed to by a4 to the system.
Increment the access count of object being pointed to by a3 by 1. So, now it becomes 4. Make Access Count Pointer of a4 point to it. FIG. 5 represents the status of the algorithm thus far.

Now let's assume deallocate(a4) is called.

The Access Count of a4 is more than 1, hence there are other objects pointing to the Referenced VHDL Object, the other access values must know that the Referenced VHDL object has been freed up. So the shared Access Count Object should not be freed up.
Set the common Access Count Object (being pointed to by a1, a2, a3 and a4) to—(present count −1), e.g.,—(4-1); If the value of the Access Count would have become zero, then a4 would have been the only one pointing to the val_t object, we could have freed up the Access Count object to the system and would have set the Access Count Pointer of a4 to null. But, as a1, a2, a3 are dangling references, we need to wait. The Access Count Object shared by a1, a2 and a3 is set to −3 as explained above. A −3 count signifies that there are three dangling references due to free up of one object. When and if all the dangling references are set to null or some valid access value, then the shared Access Count may be freed up to the system or re-used.

Delete the val_t Referenced VHDL Object (New Object (2)) being pointed to by all these pointers.

Set the Object Reference as well as the Access Count Pointer of a4 to null.

Now let's assume the deleted object New Object(2) is attempted to be referenced as a3.a11, then the following will happen:

Check if a3 had a null Access Count Pointer, and if null, output error message: "trying to access null access value". In this case it is not null.

Figure 6:
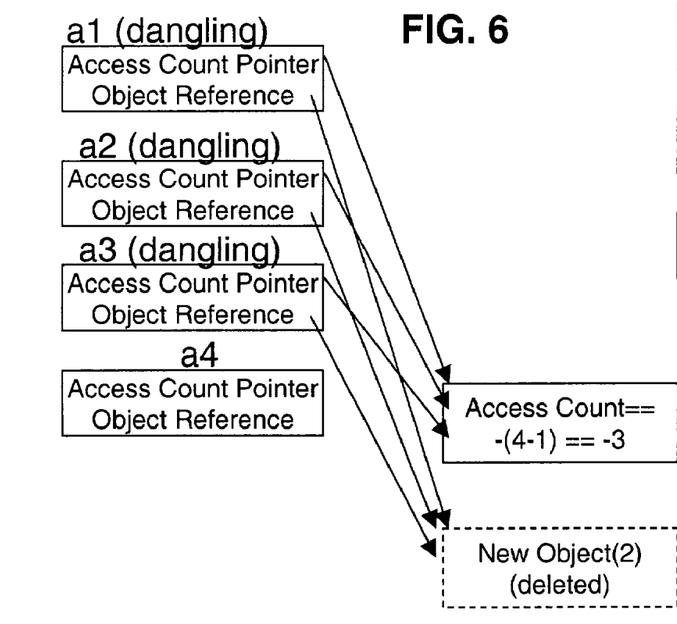
FIG. 6 is a schematic diagram illustrating access variables pointing to a common object and a shared access count object during a sixth stage in accordance to the present invention.

If a3 had a non-null Access Count Pointer, then check the Access Count Value, if negative, then that means that the common val_t Referenced VHDL Object has been freed up, so output an error message saying "dangling reference detected". FIG. 6 represents the status of the algorithm thus far.

Now, let's assume a3:=new val_t;

Set the Object Reference Pointer of a3 to a new value

The Access Count is non null and is set to −3 denoting it is pointing to a freed up object. Add one to the Access Count (If it would have become 0 then we could have freed up the Access Count object to the system). For this example, the Access Count becomes −2.

The Access Count pointer is set to be null

Now let's assume a4:=a3;

Check if a4 has non-null Access Count Pointer, if the value is positive then decrement it, if negative then increment it. If the Access Count becomes 0 then a4 would be the only one pointing to the access object, so return the access object to the pool. However, in this example, a4 has a null Access Count Pointer, so this step is skipped.

Create an Access Count Object and set it's count to 2 and make a4 and a3's Access Count Pointers point to it.

Figure 7:
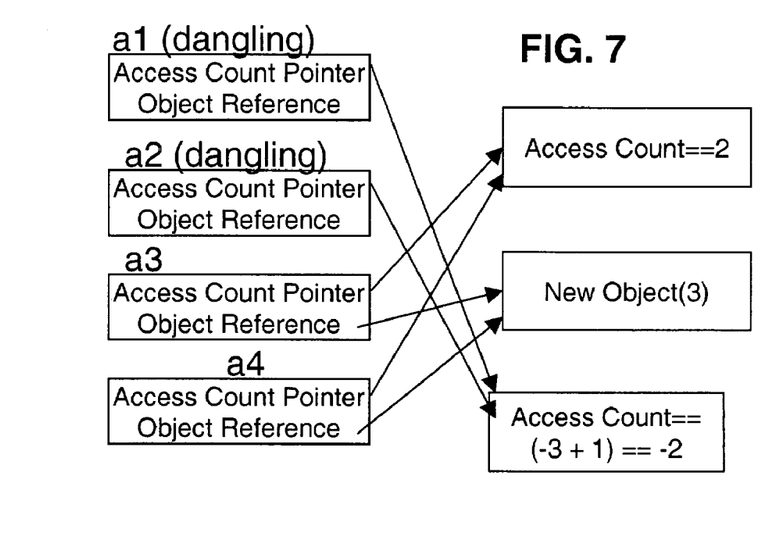
FIG. 7 is a schematic diagram illustrating access variables pointing to a common object and a shared access count object during a seventh stage in accordance to the present invention.

Set the Object Reference to point to the object pointed to by Object Reference of a3. FIG. 7 represents the status of the algorithm thus far.

Now, let's assume a1:=a2

Since a1's access count is negative, increment it, and it becomes −1. Since it is not zero yet, do not return to the pool.

Since a2's access count is negative, decrement it, it becomes −2. Thus, if one dangling pointer is assigned to another, the state remains dangling for both and the count remains right.

Figure 8:
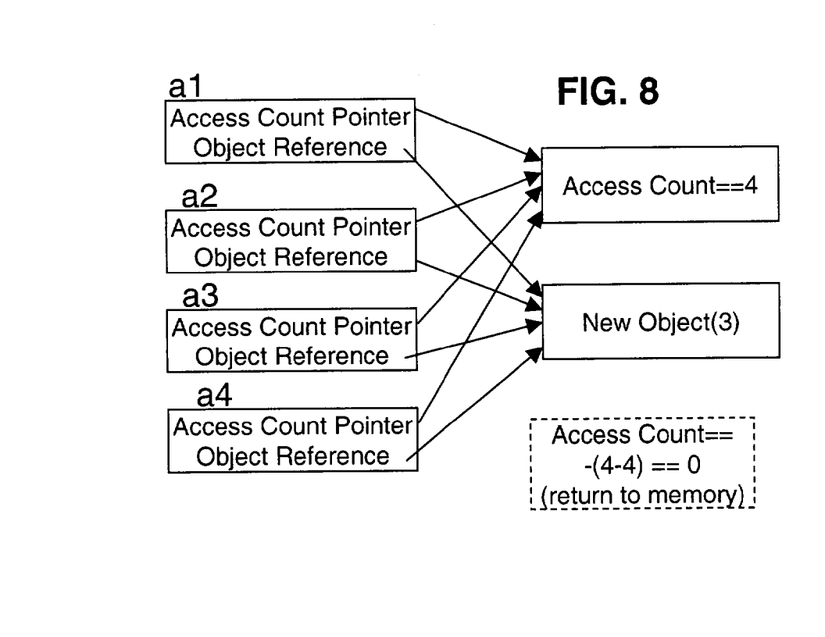
FIG. 8 is a schematic diagram illustrating access variables pointing to a common object and a shared access count object during a eighth stage in accordance to the present invention.

Now let's assume we had not done a1:=a2 in the previous step. Rather, we did a1:=a3 followed by a2:=a1; Since a1's access count is negative, increment it. It would become −1. Increment the access count of a3's Access Count pointed object by 1 (i.e. it becomes 3). Make a1's Access Count object point to a3's Access Count Object. Since, a2's access count is −1, increment it by 1 and it becomes 0. So, the access count object is now freed up. Increment the access count value of a1's Access Count pointed object by 1, and it becomes 4. Make a2's Access Count object point to a1s Access Count Object. So, a1, a2, a3 and a4 all point to the same object now and the Access Count is 4. FIG. 8 represents the status of the algorithm thus far.

Figure 9:
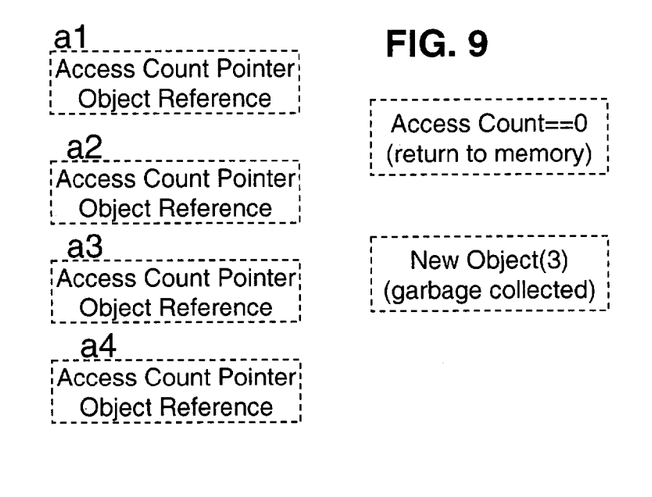
FIG. 9 is a schematic diagram illustrating access variables no longer pointing to a common object and a shared access count object during a ninth stage in accordance to the present invention.

Now let's assume that a1, a2, a3, a4 were local, variables inside a subprogram and now the subprogram is exiting. At the exit of the subprogram, a1, a2, a3, a4 will be destructed in the order of their declaration. Assuming these were declared in the order of a1, a2, a3 and a4. a1 will be destructed first. So, at the end of the destruction of a1, the Access Count will be set to 3 and the Referenced Object will not be freed up. Then a2 will be destructed, the Access Count will go down to 2 and the Reference Object will not be freed up. Then a3 will be destructed and the Access Count will go to 1, and the referenced object is still not freed up. Then a4 will be destructed and the Access Count will go down to 0. Now as the Access Count has gone down to zero, the Access Count object will be freed up and since the Object reference in not null, it knows that memory is going to leak, so it will free up the referenced VHDL object as well as doing an instant garbage collection. FIG. 9 represents the status of the algorithm thus far.

Exemplary embodiments of the present invention can be realized in hardware, software, or a combination of hardware and software. Such embodiments can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

Exemplary embodiments of the present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

Exemplary embodiments in accordance with the present invention can be embodied in other forms without departing from the spirit or essential attributes thereof. Accordingly, reference should be made to the following claims, rather than to the foregoing specification, as indicating the scope of the invention.

What is claimed is:

1. A method of detecting a dangling reference of access values and garbage collecting objects within a program, comprising the steps of:

modeling a shared access count for an object referenced by the access values;

enabling an assignment of a negative access count to the shared access count when de-allocating a pointer to the object;

maintaining an exact count of a number of the access values pointing to the object, the exact count being assigned to the shared access count; and decrementing the shared access count when the shared access count is greater than 0, and incrementing the shared access count when the shared access count is less than 0, when destroying any of the access values.

2. The method of claim 1, wherein the program is a very high speed integrated circuit hardware description language (VHDL) simulation program.

3. The method of claim 1, wherein the step of modeling comprises the step of setting an access count pointer to null.

4. The method of claim 3, wherein the step of modeling further comprises the step of setting an object reference to null.

5. The method of claim 1, wherein the method further comprises the step of freeing up an access count object pointed to by an access count pointer when the shared access count is equal to 0.

6. The method of claim 1, wherein the step of enabling comprises the step of setting the value of the shared access count to the negative of the shared access count −1 when the pointer to the object is de-allocated.

7. The method of claim 6, wherein the method further comprises the step of setting an object reference to null during the step of de-allocation.

8. The method of claim 1, wherein the method further comprises the step of detecting that the object has been de-allocated.

9. A method of detecting dangling references of access values and garbage collecting objects within a program, comprising the steps of:
- providing, for each of the access values, an object reference pointing to an allocated object and at least one access count pointer pointing to an integer object modeling a shared access count for the allocated object;
- setting the object reference and the access count pointer to null when constructing a new one of the access values;
- enabling an assignment of a negative access count to the shared access count when de-allocating a pointer to the allocated object;
- maintaining an exact count of a number of the access values pointing to the allocated object, the exact count being assigned to the shared access count; and
- decrementing the shared access count when the shared access count is greater than 0, and incrementing the shared access count when the shared access count is less than 0, when destroying any of the access values.

10. The method of claim 9, wherein the integer object is a dynamically allocated object and wherein the integer object can have more than one access count pointer pointing to the integer object.

11. The method of claim 9, wherein the step of setting the object reference and the access count pointer to null when constructing a new one of the access values is done when the new one of the access values is not initialized with another one of the access values.

12. The method of claim 9, wherein the program is a simulation program and the allocated object is an allocated very high speed integrated circuit hardware description language (VHDL) object.

13. A machine readable storage, having stored thereon a computer program having a plurality of code sections executable by a machine for causing the machine to perform the steps of:
- modeling a shared access count for an object referenced by access values;
- enabling an assignment of a negative access count to the shared access count when de-allocating a pointer to the object;
- maintaining an exact count of a number of the access values pointing to the object, the exact count being assigned to the shared access count; and
- decrementing the shared access count when the shared access count is greater than 0, and incrementing the shared access count when the shared access count is less than 0, when destroying any of the access values.

14. The machine readable storage of claim 13, wherein the computer program is a very high speed integrated circuit hardware description language (VHDL) simulation program and the step of modeling comprises causes the machine to set an access count pointer to null and set an object reference to null.

15. The machine readable storage of claim 13, wherein the computer program further causes the machine to free up an access count object pointed to by an access count pointer when the shared access count is equal to 0.

16. The machine readable storage of claim 13, wherein the computer program further causes the machine when the pointer to the object is de-allocated to set the value of the shared access count to the negative of the shared access count −1 and to set an object reference to null.

17. The machine readable storage of claim 13, wherein the computer program is a simulation program written in a higher level language for simulating hardware logic described by a hardware language that supports pointers and dynamic allocations.

18. A machine readable storage, having stored thereon a computer program having a plurality of code sections executable by a machine for causing the machine to perform the steps of:
- providing, for each of the access values, an object reference pointing to an allocated object and at least one access count pointer pointing to an integer object modeling a shared access count for the allocated object;
- setting the object reference and the access count pointer to null when constructing a new one of the access values;
- enabling an assignment of a negative access count to the shared access count when de-allocating a pointer to the allocated object;
- maintaining an exact count of a number of the access values pointing to the allocated object, the exact count being assigned to the shared access count; and
- decrementing the shared access count when the shared access count is greater than 0, and incrementing the shared access count when the shared access count is less than 0, when destroying any of the access values.

19. The machine readable storage of claim 18, wherein the computer program is a simulation program written in a higher level language for simulating hardware logic described by a hardware language that supports pointers and dynamic allocations.

20. A system, comprising:
- means for performing detection of memory leak and garbage collection of access values
- means for modeling a shared access count for an object referenced by the access values;
- means for enabling an assignment of a negative access count to the shared access account when de-allocating a pointer to the object;
- means for maintaining an exact count of a number of the access values pointing to the object, the exact count being assigned to the shared access count;
- means for decrementing the shared access count when the shared access count is greater than 0, and incrementing the shared access count when the shared access count is less than 0, when destroying an of the access values; and
- a computer memory for storing the shared access count.

* * * * *